United States Patent [19]

Hayase

[11] Patent Number: 5,065,355
[45] Date of Patent: Nov. 12, 1991

[54] AUTOMATIC ROUTING METHOD FOR LSI

[75] Inventor: Michiyoshi Hayase, Kanagawa, Japan

[73] Assignee: Hitachi, Ltd., Tokyo, Japan

[21] Appl. No.: 350,573

[22] Filed: May 11, 1989

[30] Foreign Application Priority Data

May 13, 1988 [JP] Japan .................................. 63-114615

[51] Int. Cl.$^5$ ............................................. G06F 15/20
[52] U.S. Cl. ...................................... 395/800; 364/491
[58] Field of Search ... 364/200 MS File, 900 MS File, 364/490, 491

[56] References Cited

U.S. PATENT DOCUMENTS 4,636,965 1/1987 Smith et al. .......................... 364/491
4,835,705 5/1989 Fujino et al. .................... 364/490 X

OTHER PUBLICATIONS

Chi-Ping Hsu, "General River Routing Algorithm", Proc. of Design Automation Conference, 1983, pp. 578-583.

S. Kimura, et al., "An Automatic Routing Scheme for General Cell LSI", IEEE Trans. on CAD, vol. CAD-2, No, 4, Oct. 1983, pp. 285-292.

Primary Examiner—Thomas M. Heckler
Attorney, Agent, or Firm—Fay, Sharpe, Beall, Fagan, Minnich & McKee

[57] ABSTRACT

In addition to the block placement information and the logical connection information of an LSI, there are disposed a bus name list and a signal name list belonging to each of bus signals as input data. A processing consisting of the two following steps is executed as a method for searching a path for each of the bus signals. (1) A routing area, throgh which the bus signals pass, is determined by gathering all the signals in the bus signals, considering them as a virtual signal representing the bus signals, and searching the path for this virtual signal (2). For each of the signals in the bus signals the path is searched within the routing area for the bus signals obtained at Step (1).

1 Claim, 10 Drawing Sheets

CHANNEL GRAPH

FIG.7

| SIGNAL NAME | NAME OF CHANNELS CONTIGUOUS TO TERMINAL | | | |
|---|---|---|---|---|
| 70a — 205 | 402 | 403 | 404 | 405 |
| 70b — 204 | 402 | 403 | 404 | 405 |
| 70c — 203 | 402 | 403 | — | 405 |
| 70d — 202 | 402 | 403 | — | 405 |
| 70e — VIRTUAL SIGNAL | 402 | 403 | 404 | 405 |

FIG.8

BLOK PLACEMENT INFORMATION

| MAGNITUDE OF WHOLE LSI (L, W) | | NUMBER OF BLOCKS (m) |
|---|---|---|
| NAME OF BLOCK | COORDINATES OF LEFT LOWER CORNER OF BLOCK (Px, Py) | MAGNITUDE OF BLOCK (ℓ, W) |
| 83 ... | 84 ..... | 85 .... |
| ⌠ | ⌠ | ⌠ |
| ... | ..... | .... |
| ⌠ | ⌠ | ⌠ |

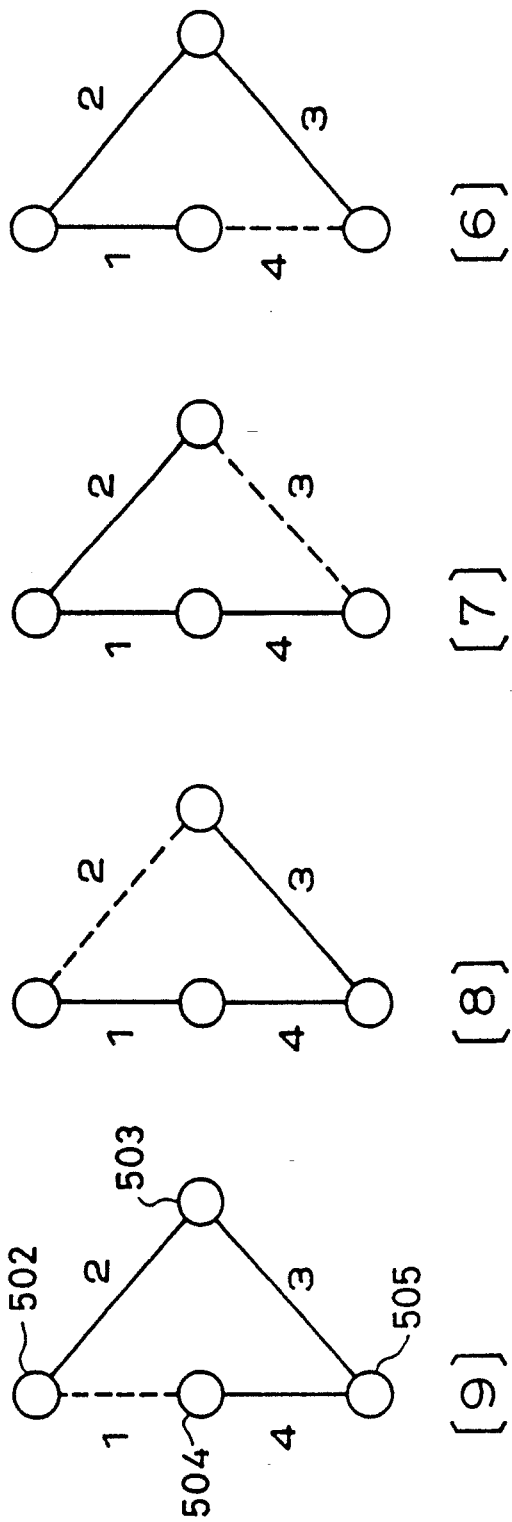

AUTOMATIC ROUTING METHOD FOR LSI

BACKGROUND OF THE INVENTION

This invention relates to an automatic routing method for determining paths for bus signals in an LSI, and in particular to an automatic routing method, which is suitable for an LSI designed according to the building block scheme, by which rectangular blocks of arbitrary size are arranged, or to the standard cell scheme, by which rectangular cells are arranged.

The bus signals play a role by the fact that a plurality of signals such as address signals, data signals, etc. are joined to one group. Consequently, if there exist differences in the length of the routing for different signals, there are produced fluctuations in the signal propagation time, i.e., arrival time of signal. These fluctuations in the arrival time of signal is called skew of bus signals. In order to drive a semiconductor device with a high speed, the skew of bus signals should be small. In order to reduce the skew, routing lengths for different signals in the bus signals should be as uniform as possible so that propagation times for different signals are approximately equal to each other.

Heretofore, according to the automatic routing scheme used for routing in an semiconductor device, since the different signals in the bus signals were treated independently as individual signals, the paths were different for the individual signals. For this reason fluctuations in the routing length for different signals in the bus signals were great. Here the path of signal means an assembly of the sub routing areas, through which the routing for that signal passes, when a routing area is divided into a plurality of sub routing areas.

FIG. 3 shows an example of result obtained by a prior art scheme, by which signals are not grouped depending on bus signals, in which routing has been made for a bus signal consisting of 4 signals between terminals of blocks 201, 206, 207 and 208 within a chip 200 and another bus signal consisting of 3 signals between terminals of the blocks 201 and 208 and external terminals. FIG. 3 shows an example of result, in which routing has been made individually for each of the signals belonging to each bus signal. FIG. 10 is a flow chart showing the prior art routing scheme for making the routing indicated in FIG. 3. Block placement information 101 and logical connection information 104 stored in an external memory device 100 are inputted (Step 301). The whole routing area is divided into several sub routing areas on the basis of the block placement information 101 (Step 302). The path for each of the signal is determined on the basis of the logical connection information 104 (Step 305). The routing pattern is determined according to the path (Step 306) and the coordinates of the routing pattern are outputted (Step 307). The result indicated in FIG. 3 is an example, for which routing has been made by choosing the paths so that the numbers of routings for signals passing through different channels are equal to each other. While the paths for signals 202 and 203 pass on the left side of the block 201, the paths for signals 204 and 205 pass on the right side of the block 201. When the paths for the different signals in a bus signal are different in this way, there are produced fluctuations in the length of routing for different signals, which increases the skew of the bus signal.

On the other hand a routing method for bus signals is described in Proc. of Design Automation Conf. (1983) pp 578-583. This literature describes a routing method for a bus signal in an area, which is a closed area enclosed by a continuous broken line and within which there are no obstacles for the routing. However, a routing area is a closed area enclosed by a continuous broken line, within which there exist a number of blocks or inhibited areas as obstacles for routing.

SUMMARY OF THE INVENTION

The object of this invention is to provide an automatic routing method, by which routings of different signals in a bus signal have a same path in order to reduce fluctuations in the propagation time of the different signals in the bus signal, when routing is made for the bus signal between terminals of several blocks included in an LSI.

In order that the routings for the different signals in the bus signal have a same path, input data and a global routing method described below are utilized. As the input data, there can be enumerated block placement information including placement coordinates for each of the blocks within the LSI as well as logical connection information gathering positional coordinates of terminals, which are to be connected at a same potential, for each of the signals. According to this invention, as input data, a bus name list and a signal name list belonging to each of the bus signals are newly disposed. In this way, it is possible to grasp all the bus signals contained in the LSI and to distinguish easily all the signals belonging to the bus signals from the others, which don't belong thereto.

A processing consisting of the following two steps is executed for searching the paths for the bus signals.

(1) Gather all the signals in the bus signals. Considering them as a virtual signal representing the bus signals, search a path for this virtual signal. A well known search method for one signal such as a method, by which the shortest path is followed on a channel graph, can be used for searching the path. The routing area, through which all the signals contained in the bus signals pass, is determined at this stage.

(2) Search a path for each of the signals in the bus signals within the region of the routing area obtained in Step (1 for the bus signals. The prior art global routing method can be used also for this search.

By disposing the bus name list and the signal name list belonging to each of the bus signals in the input data, it is possible to understand easily the correspondence relation of all the bus signal names contained in the LSI to all the signals belonging to the bus signals. Further, it is possible to understand easily the correspondence relation of each of the signals in the bus signals to the terminal belonging to this signal.

According to this invention, by gathering the terminals for all the signals in the bus signals, considering the whole of the bus signals as one virtual signal and searching the path for the bus signals by using it, the paths for all the signals belonging to the bus signals become identical to each other, and thus it is possible to reduce the fluctuations in the path length for the different signals in the bus signals.

BRIEF DESCRIPTION OF THE DRAWINGS

FIG. 7 shows terminal connection information corresponding to the routing indicated in FIG. 3;

FIG. 8 shows data structure of block placement information;

FIGS. 11A, 11B, 11C and 11D show paths, through which the routing for the bus signals can pass.

DESCRIPTION OF THE PREFERRED EMBODIMENTS

An embodiment of this invention will be explained, referring to FIGS. 1, 2, 4, 5, 6, 7 and 8.

Figure 1:
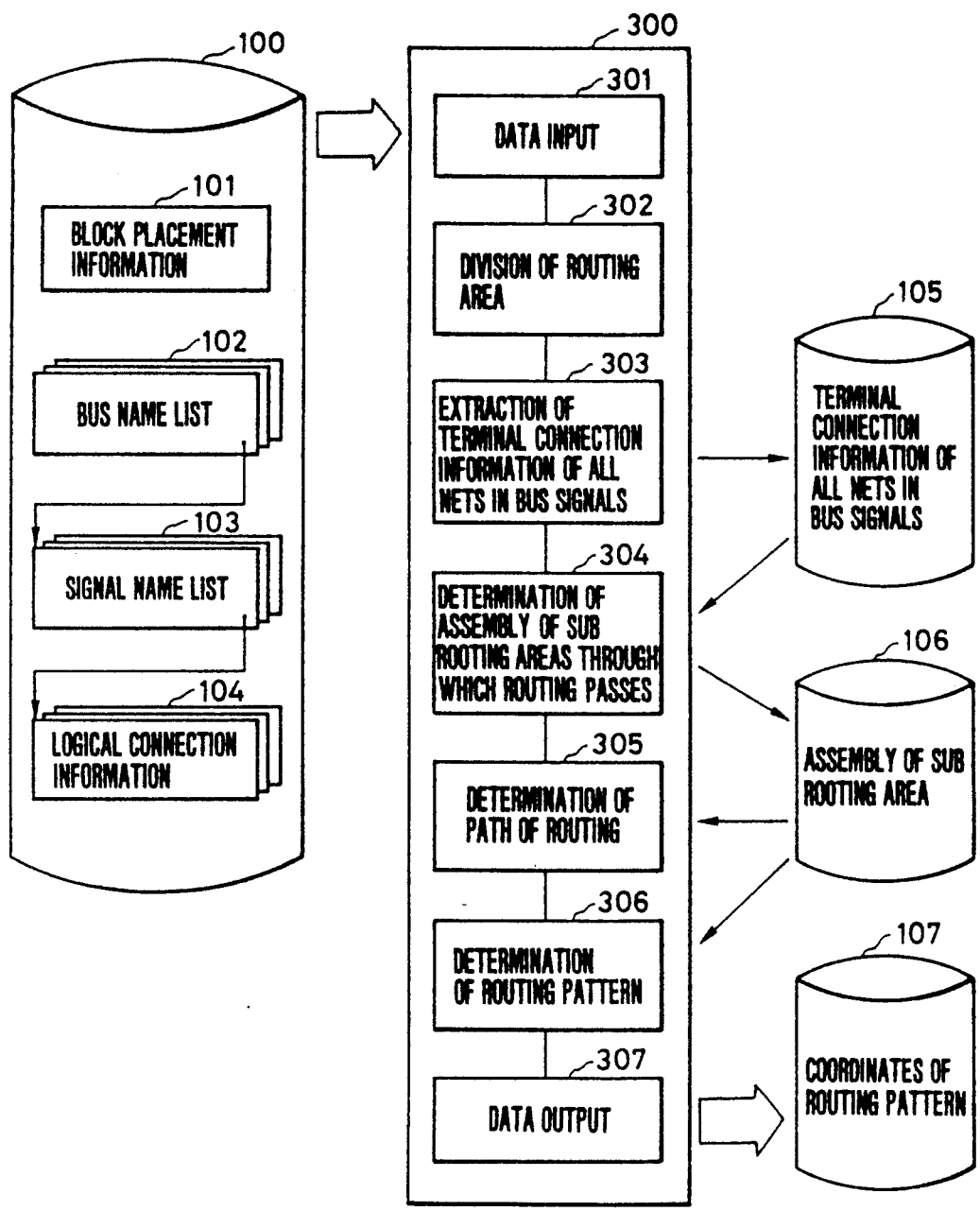
FIG. 1 is a flow chart indicating the method for routing bus signals according to this invention.

FIG. 1 is a flow chart indicating the method for routing bus signals according to this invention.

The routing processing program according to this invention, which will be described below, is executed by a processing device 300 in a computer.

At the first step 301, various sorts of data stored in an external memory device 100 are inputted. That is, block placement information 101 indicating the placement coordinates of the blocks in the LSI, logical connection information 104 including positional coordinates of the terminals, which should be connected at a same potential, gathered for each signal, as well as a bus name list 102 and a signal name list 103 belonging to each of the bus signals, which are the features of this invention are inputted. The assembly of the terminals connected at a same potential is called a net. The input data described above are formed at the stage of logical design, circuit design and layout design.

At Step 302, the whole routing area is divided into several sub routing areas. FIG. 8 indicates the data structure of the block placement information 101 used for the division of the routing area. The block placement information 101 includes data representing the magnitude of the whole LSI as well as the coordinates and the magnitude of each of the blocks. As the method for the division, a method, by which the intervals between two blocks are considered as the routing area, which is divided into rectangular sub routing areas, or a method, by which the whole LSI is considered as the routing area, which is divided by a grid, and rectangles thus formed are considered as sub routing areas, can be used.

Figure 4:
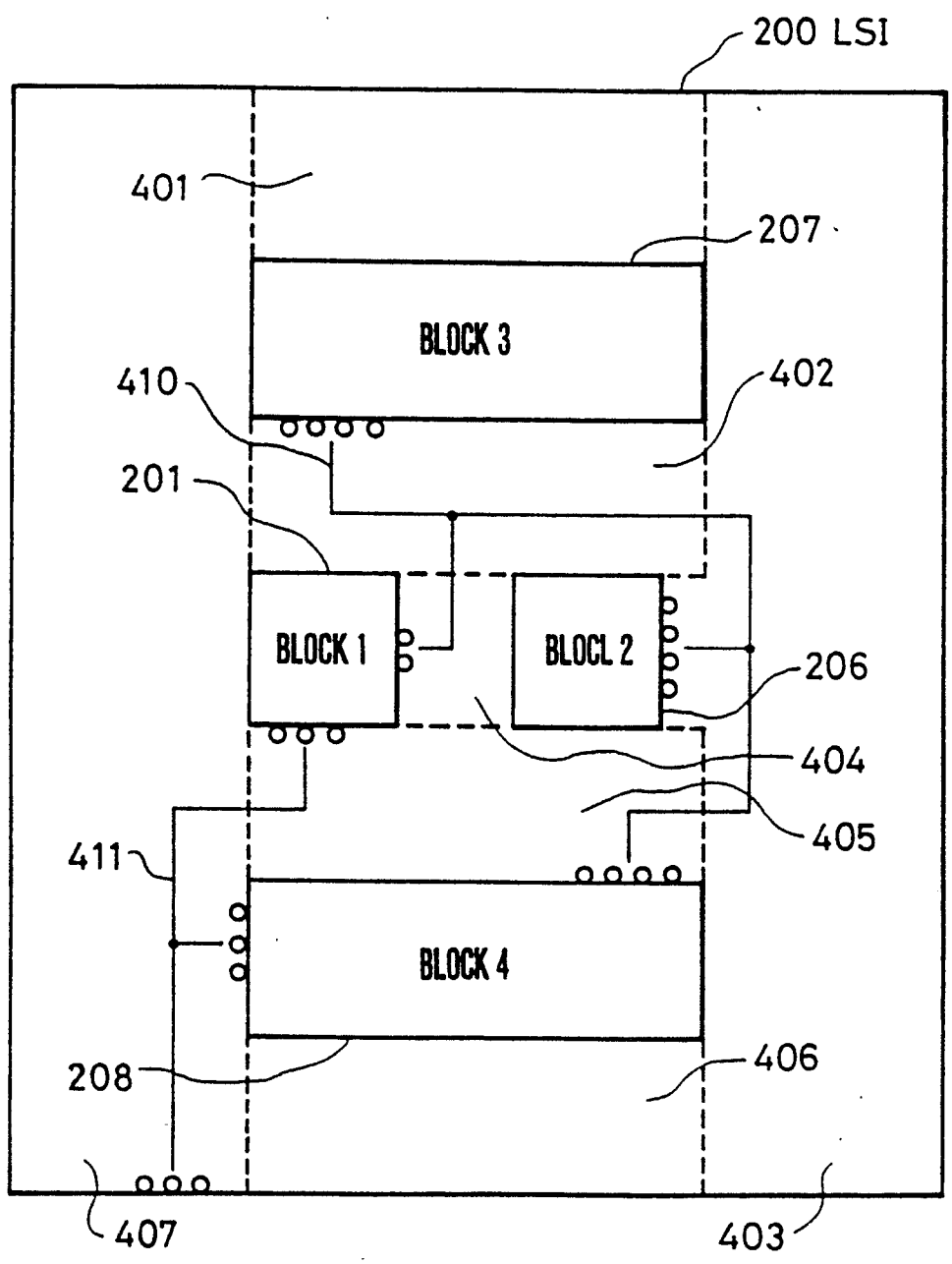
FIG. 4 shows blocks and sub routing areas within an LSI used for the example indicated in FIG. 2.
Figure 5:
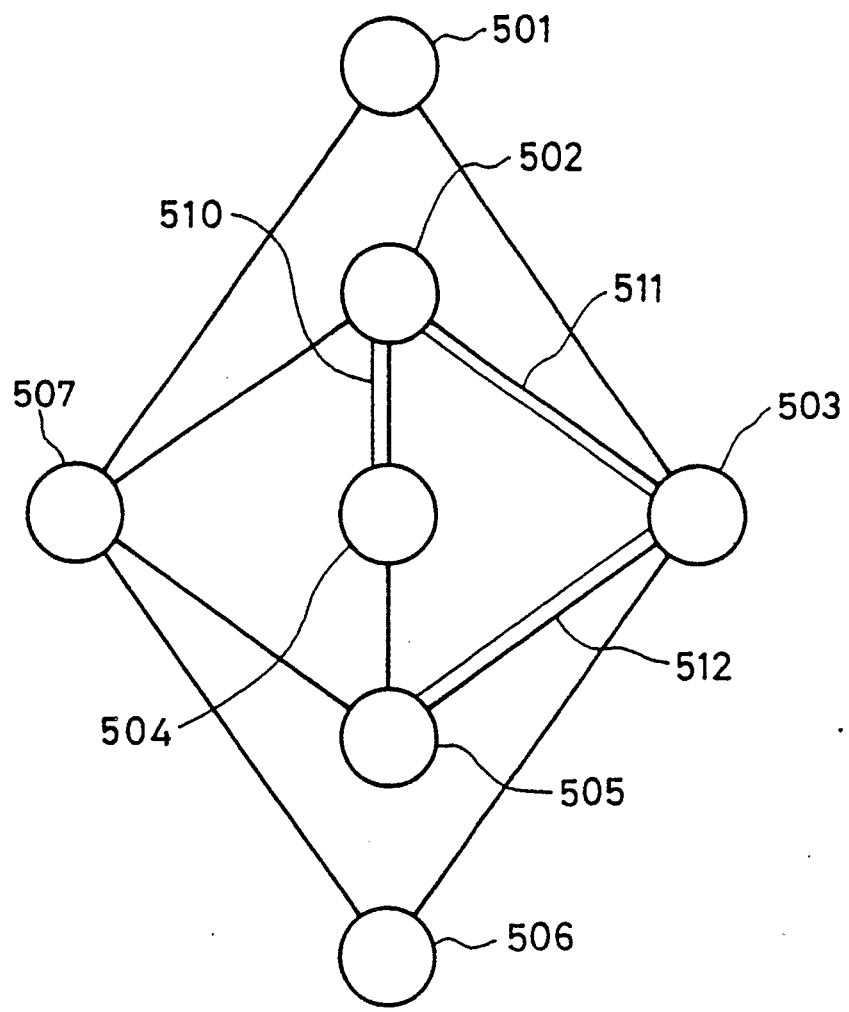
FIG. 5 is a graph representing the connection relation among the sub routine areas indicated in FIG. 4.

FIG. 4 shows a result of the division, by which the whole area within the LSI 200 except for the blocks 201, 206, 207 and 208 is considered as the whole routing area, which is divided into rectangular sub routing areas. The whole routing area is divided into sub routing areas 401 to 407 on the basis of the placement coordinates of the blocks 201, 206, 207 and 208 stored in the block placement information 101. A routing area such as the blocks 401 to 407 formed between or in the neighborhood of blocks is called a channel. The broken lines in FIG. 4 are lines dividing channels. A graph obtained by connecting nodes corresponding to channels, which are adjacent to each other, with edges, each node representing each channel, is called a channel graph. FIG. 5 is a channel graph corresponding to the dividing scheme to the channels indicated in FIG. 4. The nodes 501 to 507 in FIG. 5 correspond to the channels 401 to 407 in FIG. 4, respectively. The channel 402 in FIG. 4 is adjacent to the channels 403, 404 and 407. Consequently the node 502 is connected with the nodes 503, 504 and 507 with edges. In this way the connection relation of all the channels is clarified.

Figure 9:
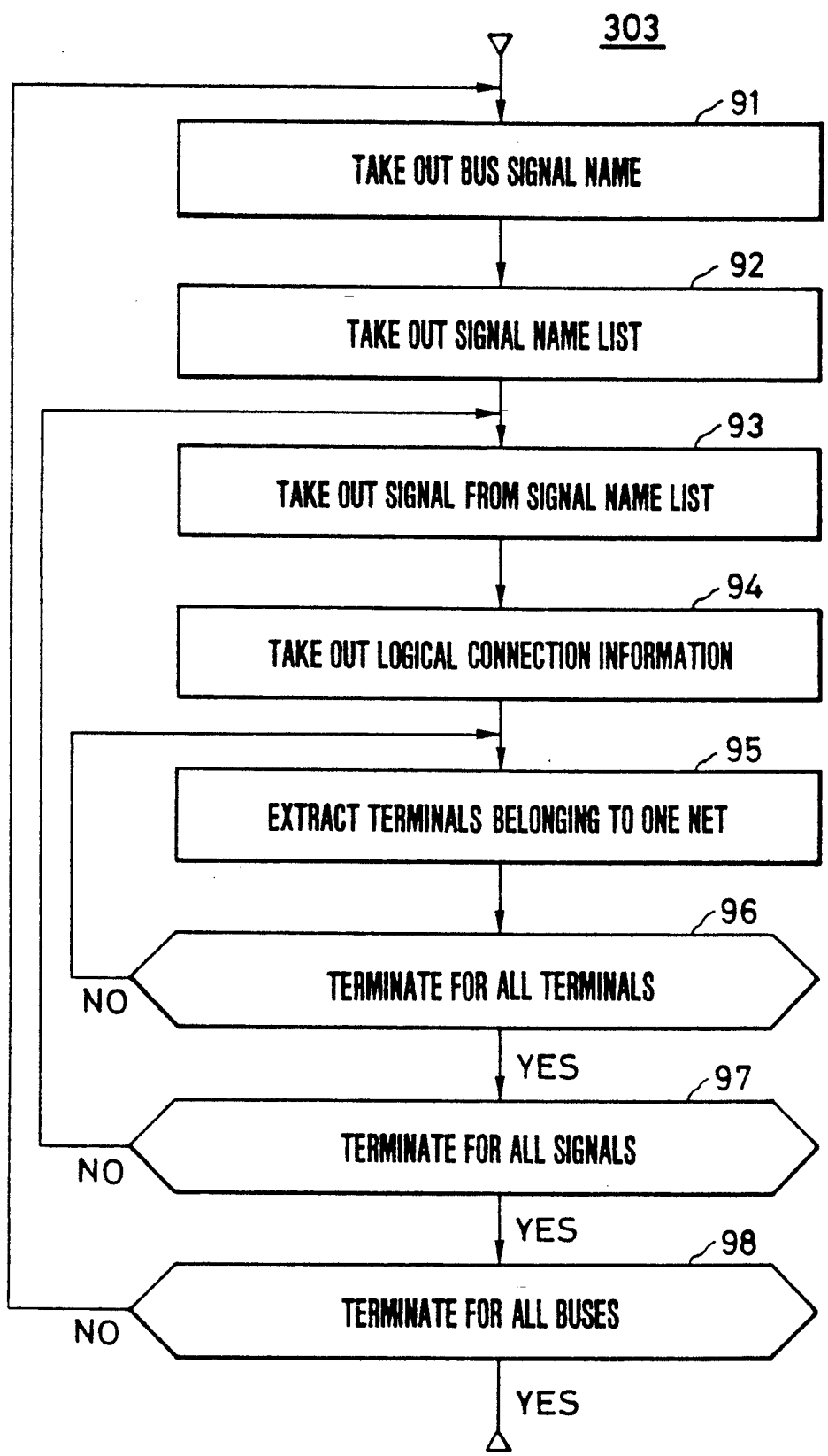
FIG. 9 is a detailed flow chart indicating the processing 303 for extracting terminal connection information in FIG. 1.
Figure 10:
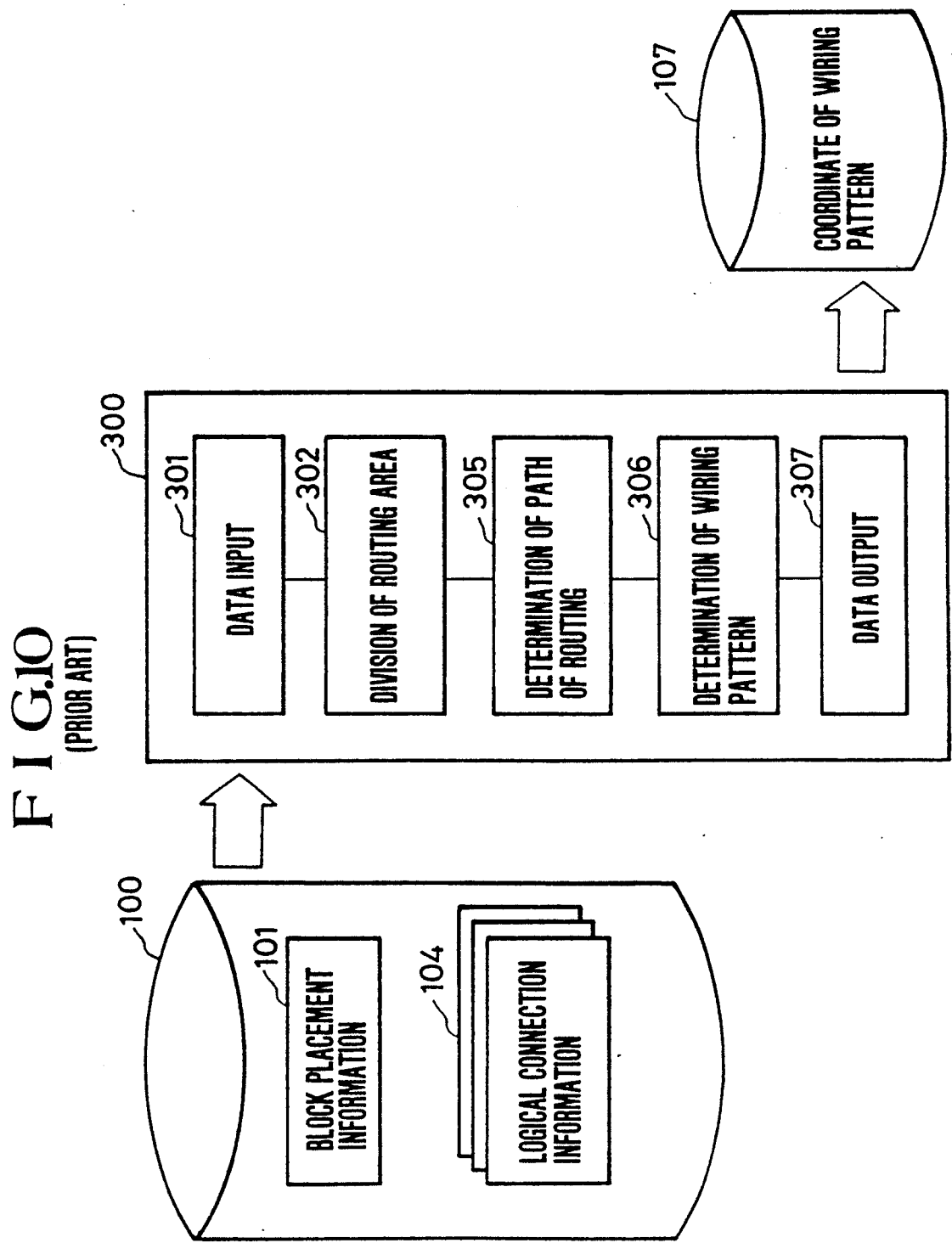
FIG. 10 is a flow chart indicating the prior art routing method.

At Step 303, terminal connection information 105 of all the nets in the bus signals is extracted. The process of the extraction of the terminal connection information 105 will be explained, using the data correlating scheme indicated in FIG. 6 and the detailed flow chart of Step 303 indicated in FIG. 9.

Figure 6:
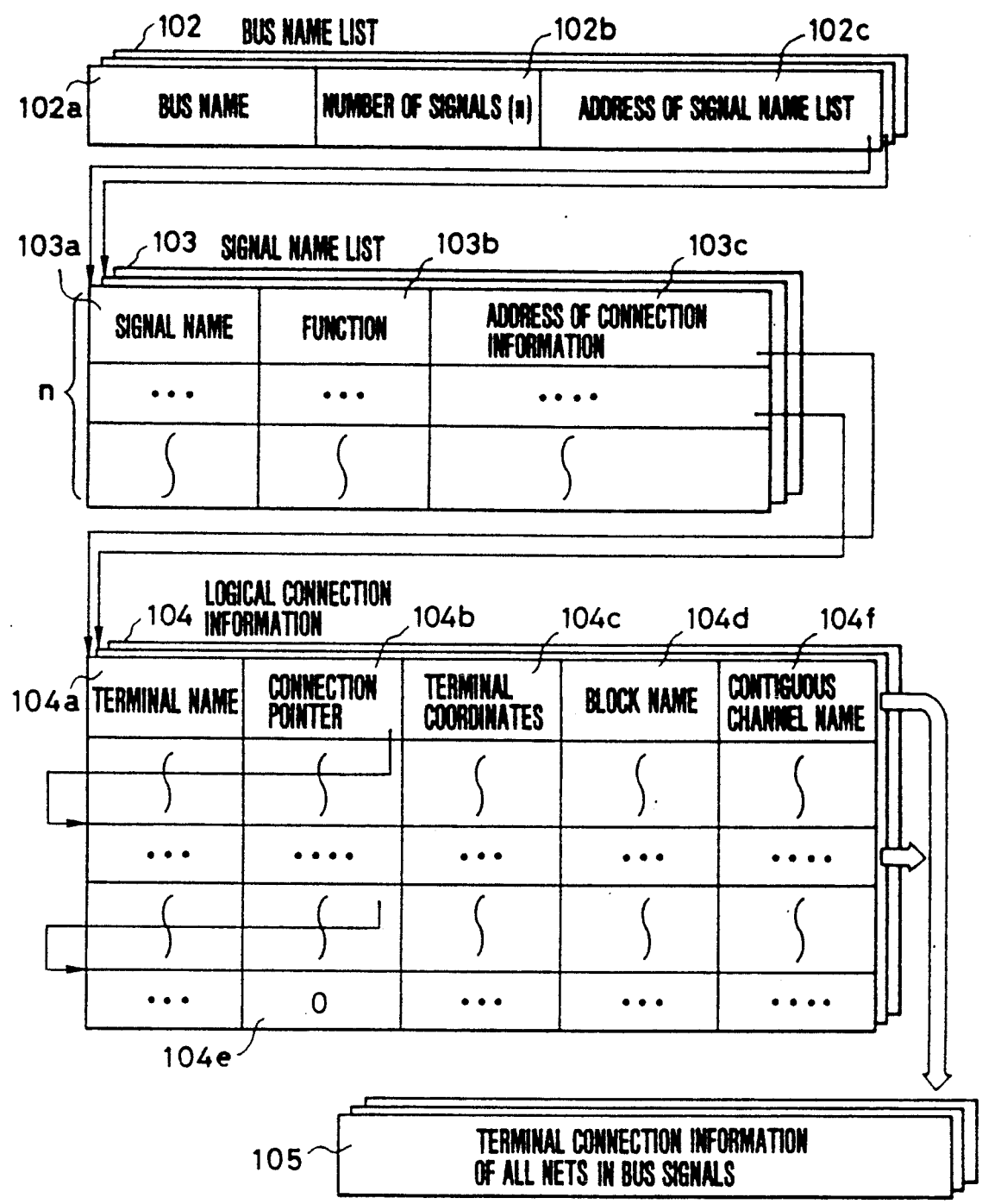
FIG. 6 shows the relation between a bus name list as well as a signal name list newly defined according to this invention and prior art logical connection information.

FIG. 6 shows the relation between the bus name list 102 as well as the signal name list 103 newly defined by this invention and the prior art logical connection information 104. The bus name list 102 is an assembly of the names of all the bus signals included in the LSI chip. The signal name list 103 is a table for managing the signals belonging to each of the bus signals in one lot. The logical connection information 104 is a table indicating the connection relation between terminals. However the data are not yet grouped on the basis of the bus signals. The logical connection information 104 includes also information of the signals, which don't belong to the bus signals.

1) One bus name 102a is chosen from the bus name list 102 (Step 91).
2) The signal name list 103 indicated by an address 102c in the bus name 102a is taken out (Step 92).
3) A signal name 103a is taken out from a number of signals, which is the number of signals (n) 102 (Step 93).
4) The logical connection information 104 indicated by the connection information address 103c of the signal having the signal name 103a is taken out (Step 94).
5) A terminal name 104a, which is at an address 103c assigned in the logical connection information 104, is taken out and the terminal coordinates 104c having this terminal name, the name 104d of the block, to which the terminal belongs, as well as the name 104f of the channel contiguous to the terminal are stored in the terminal connection information 105 of all the nets in the bus signals (Step 95).
6) The succeeding terminal name indicated by a connection pointer 104b is dealt with in the same way as 5). As indicated by a reference numeral 104e, when the value of the connection pointer is zero, it indicates that the connection chain between terminals is terminated. Here the assembly of the terminals connected through the connection pointer 104b is an assembly of terminals connected at a same potential, which constitutes a net (Step 96).

The terminal connection in formation 105 represents table data including the logical connection information 104 for each of the terminals, gathered for every signal belonging to the bus signals by the processes 5) and 6) described above.

7) By repeating the processes from 3) to 6) described above for the n signals belonging to the bus name 102a, it is possible to obtain the terminal connection information of all the nets included in a bus signal (Step 97).

8) The processes 1) to 7) described above are executed for all the bus signals registered in the bus name list 102 (Step 98).

Figure 3:
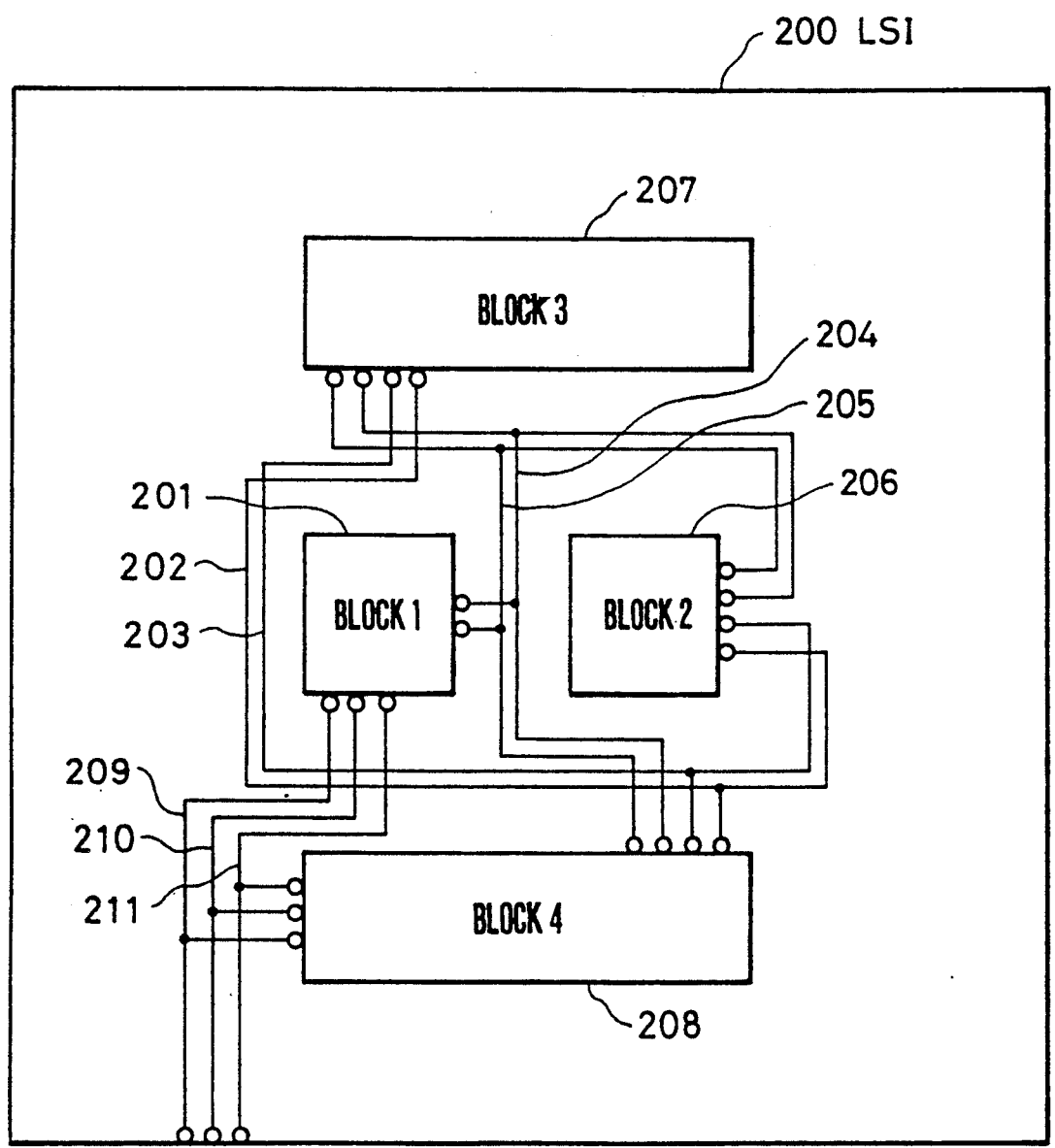
FIG. 3 shows an example of result of the routing for the bus signals obtained by the prior art routing method.

At Step 304, the assembly of the sub routing areas, through which the routing of the bus signals passes, is determined on the basis of the terminal connection information 105 for all the nets in the bus signals obtained at Step 303. The process of Step 304 will be explained by using an example, in which routing is made for one bus signal consisting of 4 signals 202, 203, 204 and 205, as indicated in FIG. 3, between terminals of the blocks 201, 206, 207 and 208 indicated in FIG. 4. Here the connection relation between terminals is identical to that indicated in FIG. 3. The first line (70a) to the fourth line (70d) in the table 70 indicated in FIG. 7 show this connection relation with data. The table 70 indicated in FIG. 7 describes explicitly the content of the terminal connection information 105 obtained at Step 303, paying attention to the connection relation of the channels, to which the terminals are contiguous. It shows, for example, that the routing for a signal having a signal name 205 should be made at least through channel areas 402, 403, 404 and 405.

At Step 304, the following processes are executed on the basis of the connection relation between terminals for each of the signals, as indicated by the lines 70a to 70d in FIG. 7, representing the data included in the terminal connection information 105.

1) Information including the terminal connection information of all the signals belonging to the bus signals is extracted. At Step 304, a table such as the table 70 indicated in FIG. 7 is formed temporarily on the basis of the terminal connection information 105. FIG. 7 shows this extracted terminal connection information at the fifth line (70e). That is, the bus signals pass through the channels 402, 403, 404 and 405.

2) A signal connecting the channels indicated at the fifth line (70e) in FIG. 7 is supposed. For the sake of simplicity this is called a virtual signal. The virtual signal, which is in reality the bus signals, is considered as a signal and the assembly 106 of the sub routing areas (channels), through which the routing for the virtual signal passes, is determined by using the global routing method utilizing the channel graph indicated in FIG. 5. 4 routings indicated in FIGS. 11A, 11B, 11C and 11D are possible, on the basis of the channel graph indicated in FIG. 5, as paths connecting the channels 402, 403, 404 and 405, through which the virtual signal passes. Further the degree of crowd of each of the joints of the channels, etc. are given to each of the edges of the graphs indicated in FIGS. 11A, 11B, 11C and 11D as a weight. When the optimum path is selected, using the sum of the weights of the paths indicated between parentheses, it is determined that FIG. 11D represents the path of the virtual signal.

The paths obtained on the channel graph are indicated by double lines 510, 511 and 512 in FIG. 5. Reference numeral 410 in FIG. 4 illustrates the path of the virtual signal on the LSI according to the obtained path. The path 410 shows the outline of the path for the bus signals.

Figure 2:
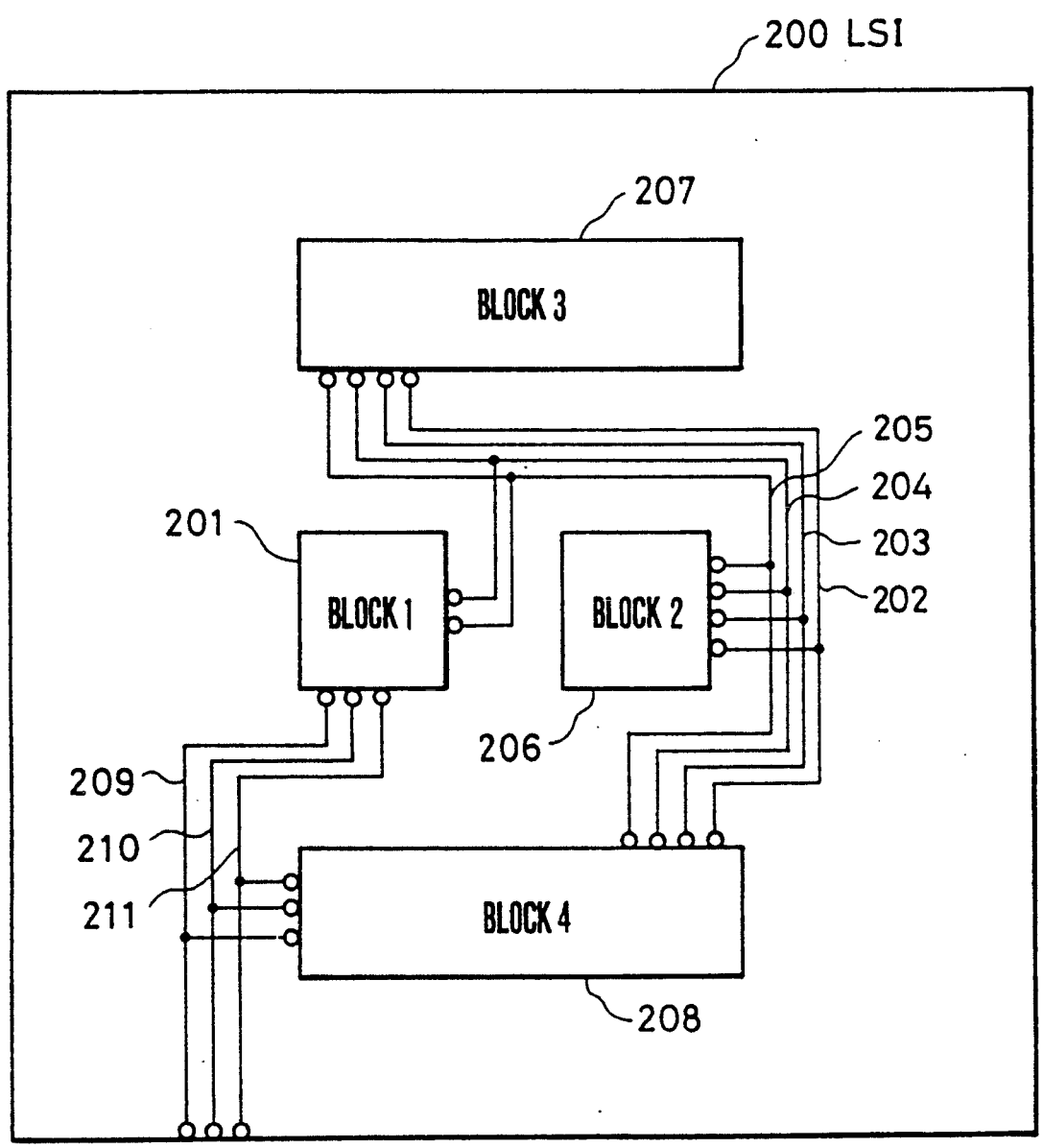
FIG. 2 shows an example of result of the routing for the bus signals obtained by the routing method according to this invention.

At Step 305, the path is obtained in the assembly of the sub routing areas constituting the obtained path for every signal in the bus signals. When there exist terminals only on one of the upper and lower edges of a channel, as indicated in FIG. 4, routings are assigned one after another successively from the edge, where there exist the terminals towards edges, where there exist no terminals. For example, for the channel 402, routings are assigned successively for the signals 202, 203, 204 and 205 so that they don't intersect each other, as indicated in FIG. 2.

Step 306 is a process for determining the routing pattern. The absolute coordinates of the routing pattern for every signal in each of the sub routing areas are so determined that there is produced no short between different signals.

At this step, paths having a finite width passing through the channels are cut out for every channel and the routing pattern within each of the channels is determined. The routing pattern is so determined that the routings in adjacent two channels are matched at the joint therebetween. As the method for routing between different channels, for example the method published in IEEE Trans. on CAD, vol. CAD-2, No. 4, pp 285-292 (1983) can be used.

Step 307 is an output process. At the output process coordinates 107 of the routing pattern are outputted. In the case where blocks are displaced, positional coordinates of the blocks after the change as well as the magnitude of the whole LSI are also outputted.

FIG. 2 shows a result of a routing for the bus signals similar to that indicated in FIG. 3 by the routing method according to this invention described above. As can be seen there, fluctuations in the routing length for different signals in the bus signals are small in the obtained result of the routing.

In the case where it is impossible to put all the routing patterns in a channel, when the routing patterns are determined at Step 306 in FIG. 1, blocks are displaced so as to increase the width of the channel and further the magnitude of the LSI, as described previously. The magnitude of the LSI and the placement of the blocks are finally determined after the determination of the routing patterns at Step 306.

Apart from the method described above, as methods for modifying the routing patterns, the following two can be enumerated.

1) At Step 304 the sub routing areas, through which the bus signals pass, are modified. At this time other paths are selected by using the channel graph indicated in FIG. 5.

2) A bus signal is divided further into 2 bus signals, depending on the restriction on its function or its routing and routing for one of them is made through another path.

Since both 1) and 2) can utilize the method according to this invention, by which the bus signals are gathered in one group, for which the path is selected, modification can be made more easily than by the prior art method, by which the paths are modified individually for every signal.

I claim:

1. An automatic routing method for LSI for routing bus signal lines between terminals of blocks arranged on the LSI, comprising the steps of:

a) inputting block placement information as well as logic connection information and inputting further a bus signal list as well as a plurality of signal name list belonging to each of bus signals to a memory;
b) dividing a routing area into a plurality of sub routing areas, using said block placement information;
c) selecting all the signals belonging to one bus signal by using said bus name list and said signal name list and said logic connection information; determining a representative signal for routing, corresponding to said signals;
d) determining an assembly of sub routing areas, through which the routing for said representative signal passes, according to said logic connection information;
e) determining a path, through which the routing for each of the signals belonging to the bus signals passes, within said assembly of the sub routing areas, according to said logic connection information;
f) determining a routing pattern for each of the signals within said assembly of sub routing areas determined at said step d); and
g) outputting coordinate information of said routing pattern to an external memory.

* * * * *